United States Patent

Kuo et al.

[11] Patent Number: 6,125,058
[45] Date of Patent: Sep. 26, 2000

[54] SYSTEM FOR OPTIMIZING THE EQUALIZATION PULSE OF A READ SENSE AMPLIFIER FOR A SIMULTANEOUS OPERATION FLASH MEMORY DEVICE

[75] Inventors: Tiao-Hua Kuo, San Jose; Nancy S. Leong, Sunnyvale; Takao Akaogi; Johnny C. Chen, both of Cupertino, all of Calif.

[73] Assignees: Advanced Micro Devices, Inc., Sunnyvale, Calif.; Fujitsu Limited, Kanagawa, Japan

[21] Appl. No.: 09/421,982

[22] Filed: Oct. 19, 1999

[51] Int. Cl.[7] .............................. G11C 16/06; G11C 7/00
[52] U.S. Cl. ............................. 365/185.21; 365/185.33; 365/201
[58] Field of Search ................... 365/185.11, 185.21, 365/185.22, 185.29, 185.33, 218, 201

[56] References Cited

U.S. PATENT DOCUMENTS

| | | | |
|---|---|---|---|
| 5,140,553 | 8/1992 | Choi et al. | 365/201 |
| 5,400,282 | 3/1995 | Weiler et al. | 365/201 |

*Primary Examiner*—Trong Phan
*Attorney, Agent, or Firm*—Brinks Hofer Gilson & Lione

[57] ABSTRACT

A system for optimizing the equalization pulse of a read sense amplifier is disclosed. A number of capacitor circuits are provided that can be coupled to a timing circuit in a variety of combinations. The different combinations of coupled and decoupled capacitor circuits result in different durational lengths of the equalization pulse. A testing sequence determines the optimal durational length of the equalization pulse by testing the different combinations of coupled capacitors. The optimal combination is then permanently stored in attribute cells for optimizing the equalization pulse in normal operation.

17 Claims, 7 Drawing Sheets

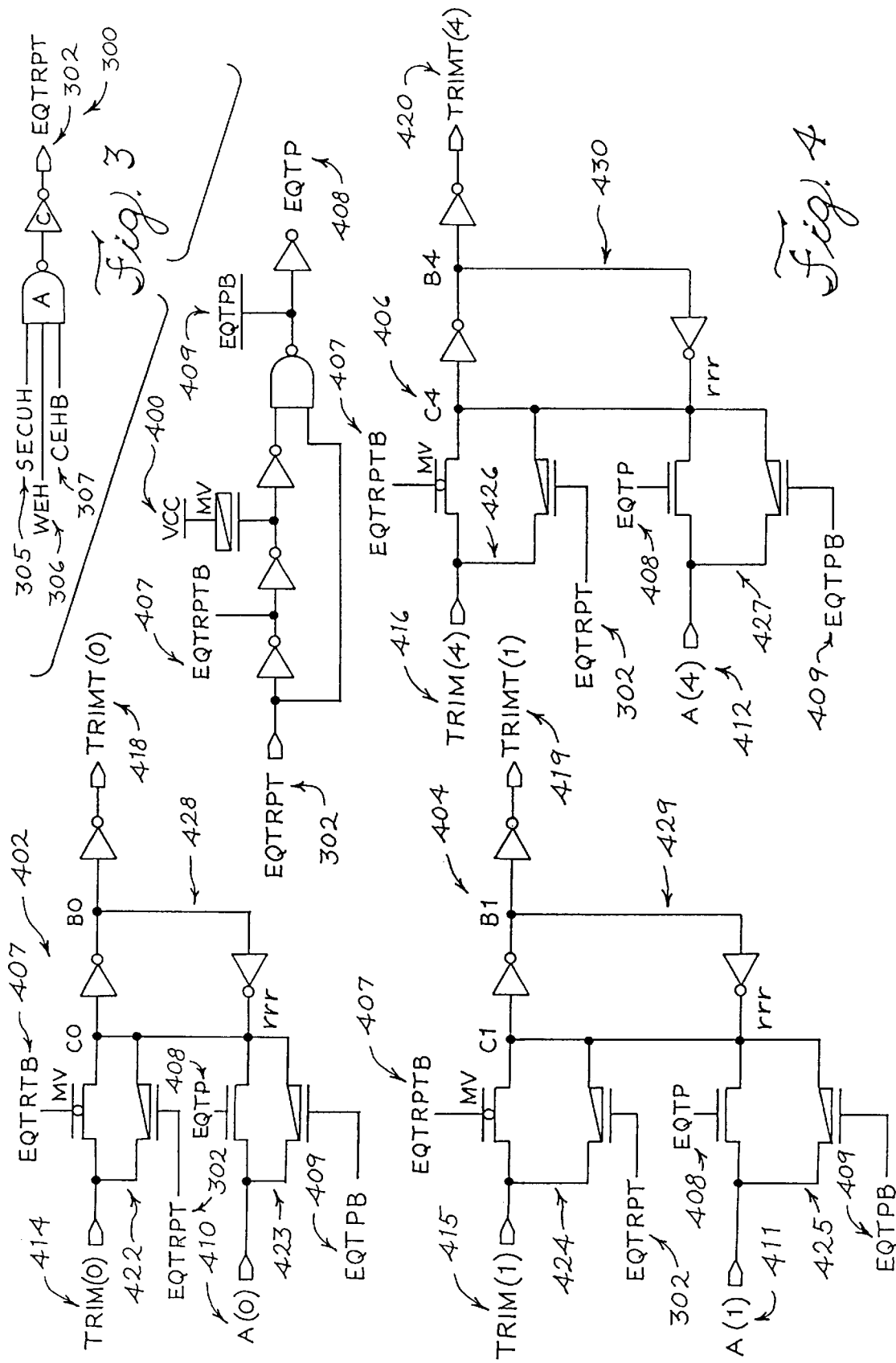

Fig. 6

| TRIMT(4) | TRIMT(1) | TRIMT(0) | Nos. of Capacitors | Equalization Pulse Length |
|---|---|---|---|---|
| 0 | 0 | 0 | 7 | 45 nS |
| 0 | 0 | 1 | 6 | 41.1 nS |
| 0 | 1 | 0 | 5 | 36.9 nS |
| 0 | 1 | 1 | 4 | 32.9 nS |
| 1 | 0 | 0 | 3 | 28.5 nS |
| 1 | 0 | 1 | 2 | 24.6 nS |
| 1 | 1 | 0 | 1 | 20.3 nS |
| 1 | 1 | 1 | 0 | 16.2 nS |

SYSTEM FOR OPTIMIZING THE EQUALIZATION PULSE OF A READ SENSE AMPLIFIER FOR A SIMULTANEOUS OPERATION FLASH MEMORY DEVICE

COPYRIGHT NOTICE

A portion of the disclosure of this patent document contains material which is subject to copyright protection. The copyright owner has no objection to the facsimile reproduction by anyone of the patent document or the patent disclosure, as it appears in the Patent and Trademark Office patent file or records, but otherwise reserves all copyright rights whatsoever.

BACKGROUND

Computers, personal digital assistants, cellular telephones and other electronic systems and devices typically include processors and memory. The memory is used to store instructions (typically in the form of computer programs) to be executed and/or data to be operated on by the processors to achieve the functionality of the device. In some applications, the systems and devices may require that the instructions and/or data be retained in some form of a permanent/non-volatile storage medium so that the information is not lost when the device is turned off or power is removed. Exemplary applications include computer BIOS storage and diskless handheld computing devices such as personal digital assistants.

One way to provide such non-volatile storage capability is to include a mass-storage device such as a hard disk drive. Hard disk drives are mechanical devices which store data on rotating magnetic platters. However, such devices may be difficult to fit in small systems and may have significant reliability, cost and manufacturing constraints. An alternative to such devices are integrated-circuit based non-volatile memories. One type of non-volatile memory that can be used is Erasable Programmable Read Only Memory ("EPROM"). While conventional EPROM's provide reliable non-volatile storage, they may not be able to be reprogrammed in the field in a practical manner. For example, EPROM's typically require exposure to ultraviolet light to erase them which may require that the EPROM memory chips be removed from the device. Once erased and reprogrammed, they are placed back in the device. In many applications, removing the memory to reprogram the device is not practical. In addition, besides not being easily reprogrammed, EPROM's may not have satisfactory data storage densities.

To avoid the complexity of EPROM's and to provide a device that can be reprogrammed in the field, many electronic designs use Electrically Erasable Programmable Read Only Memory ("EEPROM"), Static Random Access Memory ("SRAM") or flash memory, which can be reprogrammed electrically and without special hardware. SRAM is not technically a form of non-volatile memory but can be used in some applications requiring non-volatile capability.

EEPROM has the disadvantages of being expensive and having a very limited life cycle, i.e. an EEPROM can only be erased and rewritten a limited number of times before the device becomes non-functional. SRAM offers high operating speeds but only maintains its contents as long as power is supplied, therefore requiring a battery or other power source. This necessitates additional hardware to maintain power to the SRAM to preserve the stored contents which increases manufacturing cost and complexity. Further, the additional hardware may put undesirable constraints on the physical size of the design. In addition, EEPROM's and SRAM's may not have as high a data storage density as compared to other forms of storage. Therefore, where cost, size or density is a factor, flash memories are preferred because they may be simpler to reprogram in the field then EPROM's, less expensive than EEPROM's, easier to implement than battery-backed SRAM's and available in higher data storage densities.

Flash memory (or flash RAM) is a form of non-volatile storage which uses a memory cell design with a floating gate. High voltages are applied to the memory cell inputs to program/store charge on the floating gate or to erase/remove charge from the floating gate. Programming occurs by hot electron transfer to place charge on the floating gate while erasure makes use of Fowler-Nordheim tunneling in which electrons pierce through a thin dielectric material, reducing the amount of electronic charge on the floating gate. Erasing a cell sets the logical value of the cell to "1" while programming the cell sets the logical value to "0". Aside from programming or erasing operations, a flash memory operates similarly to a randomly accessible read only memory (ROM). Conventionally, a flash memory chip, including the flash memory storage cells and support logic/circuitry, is made by fabricating layers of semiconductor material and interconnect layers of polysilicon and first and second metal layers onto a substrate. It will be appreciated that there are numerous integrated circuit fabrication techniques, involving more or fewer layers, which are applicable herein.

Prior flash memories could only be erased by erasing the entire memory chip also known as bulk erasure. Byte by byte erasure was not possible. To somewhat alleviate this problem, modem flash memory is typically divided logically into blocks called "sectors" where each sector contains a portion of the total bytes of data storage available. For example, a typical flash memory may have 32 megabits of total storage and be logically broken down into 64 sectors, each sector containing 64 Kilobytes of data (one byte being equal to eight bits). This arrangement allows for the option of erasure of one sector at a time in addition to bulk erasure of the entire memory. While typical flash memories are still incapable of byte by byte erasure, data in the flash memory may still be programmed byte by byte (or sometimes word by word, where a word equals four bytes) depending on the implementation. It will be appreciated that the granularity by which a flash memory device can be programmed or erased may vary and that granularities down to bit level programming/erasure are contemplated.

In order to program and/or erase a flash memory, typically a complex process must be followed. For example, before erasing a particular sector, that sector must be programmed (known as "pre-programming"). These steps of erasing and programming involve complex application of high voltages to the memory cells for specified periods of time and in particular sequences. Many flash memories provide embedded state machines which perform the complex programming and erasing operations automatically. These processes of programming and erasing a flash memory may take a long time to complete. A typical erase sequence can take anywhere from 0.7 seconds up to 15 seconds per sector. To erase an entire chip can take up to 49 seconds depending on the number of sectors. While programming is much faster, on the order of 7 to 300 microseconds per byte, it is still slow compared to other memory devices. Programming an entire chip can still take up to 120 seconds (including the time to verify the data) depending on the capacity of the chip. Typically, standard Dynamic Random Access Memory ("DRAM") offers write access times on the order of nanoseconds, a difference between flash memory of many orders of magnitude.

This complex nature of programming and erasing flash memory devices leads to a major problem in that they do not provide sufficiently fast write access which then affects read accesses. For example, conventional flash memory devices typically do not allow a processor to perform a read operation while a program or erase operation is underway in the flash memory device. In most implementations, the processor is required to periodically poll a status register of the flash memory device to detect the end of the program or erase operation before initiating a read operation to the flash memory device.

Unfortunately, as noted above, the programming and erase cycle times for typical flash memory devices are orders of magnitude greater than acceptable write access times of a conventional random access main memory using, for example, Dynamic Random Access Memory ("DRAM"). Such long latencies associated with programming or erase operations can lock up the operating system and prevent the system from functioning for unacceptably long time intervals if the flash memory is the only memory in the electronic system. Some prior flash memories allow erase suspend operations in order to address this problem. Erase suspend allows the processor to pause an erase operation so another sector can be read. However, such memories typically still impose a suspend latency interval of several microseconds before a read operation can be initiated. A typical suspend latency interval is from 0.1 to 20 microseconds.

Prior systems may employ multiple flash memory devices in an attempt to prevent such operating system lock up. In such systems, the processor usually has read access to one of the flash memory devices while other flash memory devices are undergoing a program or erase operation. However, such systems typically suffer from high costs because multiple flash memory devices are implemented even though the capacity of a single flash memory device may accommodate the needs of the particular electronic device.

Another prior art system uses a flash memory in combination with an EEPROM memory. This system allows a read operation of one of the memories while writing to the other. However, the size of an EEPROM memory cell is significantly larger than that of a flash memory cell which reduces the amount of storage that can be placed on the memory chip. Further, there are significant design and manufacturing complexities involved with integrating two different memory technologies on the same chip. Therefore, a device which uses an EEPROM in combination with a flash memory will typically be more expensive both to design and manufacture.

In addition, programming and erasing a flash memory involves higher than normal voltages as compared to performing read operations. The use of these higher than normal voltages can cause problems when trying to implement the capability to simultaneously read while programming/erasing. Such problems include difficulties in distributing the high voltages required for the program and erase operations along with normal voltage for read operations and handling increased noise induced on the read sense outputs by the use of high voltages elsewhere within the device. Further, depending on the implementation, redundant logic may also be employed which introduces further complexities.

Accordingly, there is a need for an efficiently designed and manufacturable flash memory device that allows simultaneous read and write operations.

SUMMARY OF THE INVENTION

The present invention is defined by the following claims, and nothing in this section should be taken as a limitation on those claims. By way of introduction, the preferred embodiments described below relate to equalization pulse of a read sense amplifier. The durational length of the equalization pulse limits the operational speed of the read sense amplifier. In order to optimize the durational length of the equalization pulse, a number of capacitor circuits are provided which can be coupled and uncoupled from a timing circuit in various combinations. Thus, in a testing sequence various equalization pulses can be tested to determine the optimal durational length. The optimal combination of capacitors is then permanently programmed into attribute memory cells which control the combination of capacitors during normal operation of the memory device.

BRIEF DESCRIPTION OF THE DRAWINGS

FIG. 3 depicts a schematic diagram of an equalization pulse test mode circuit.

FIG. 4 depicts a schematic diagram of a control circuit that provides control signals for the switching circuits; and three matching schematic diagrams of the switching circuits.

FIG. 6 shows a table of various combinations of capacitors and the corresponding equalization pulse durational length.

DETAILED DESCRIPTION OF THE PRESENTLY PREFERRED EMBODIMENTS

Herein, the phrase "coupled with" is defined to mean directly connected to or indirectly connected with through one or more intermediate components. Referring now to the Figures and in particular, FIG. 1, there is schematically shown a flash memory device 100 according to the present invention that provides for reading while simultaneously undergoing a program or erase operation. The memory device 100 according to the present invention may include one or more components of the memory devices disclosed in U.S. Pat. No. 5,867,430 entitled "BANK ARCHITECTURE FOR A NON-VOLATILE MEMORY ENABLING SIMULTANEOUS READING AND WRITING," to Chen et al and U.S. Pat. No. 5,847,998 entitled "NON-VOLATILE MEMORY ARRAY THAT ENABLES SIMULTANEOUS READ AND WRITE OPERATIONS," to Van Buskirk, both of which are herein incorporated by reference and further describe the implementation and operation of a device of this type. The memory device 100 may also include one or more components of such exemplary flash memory devices capable of simultaneous read and write operation as the Am29DL162C and Am29DL163C 16 megabit ("Mb") flash memory chips and the Am29DL322C and Am29DL323C 32 Mb flash memory chips manufactured by Advanced Micro Devices, Inc. located in Sunnyvale, Calif. For more detail regarding these exemplary flash memory chips, refer to "Am29DL322C/Am29L323C 32 Megabit (4M×8-Bit/2M× 16-Bit) CMOS 3.0 Volt-only, Simultaneous Operation Flash Memory" Datasheet and "Am29DL162C/Am29L163C 16 Megabit (2M×8-Bit/1M×16-Bit) CMOS 3.0 Volt-only, Simultaneous Operation Flash Memory" Datasheet. While the exemplary devices disclosed above have capacities of 16 or 32 Mb, it will be appreciated that the embodiments disclosed herein are equally applicable to devices with higher bit densities such as 64 or 128 Mb devices.

In a typical embedded application of the above exemplary simultaneous operation capable flash memory 100, the available data storage space can be structured to store data and boot code in one bank and control code in another bank. The control code, which can contain command sequences which tell one bank, for example, bank 196, to program/erase data sectors, can reside as executable code in the alternate bank, for example bank 194. While the first bank is being programmed/erased, the system can continue to execute code from the alternate bank to manage other system operations. Similarly, depending on the system implementation, the CPU can also execute code from the first bank while the alternate bank undergoes a program/erase. There is no bank switching latency and no need to suspend the program/erase operation to perform the read. This minimizes the CPU's read/write cycle time, maximizes data throughput and reduces overall system cost by eliminating the need for additional hardware. It will be appreciated that while the exemplary devices have two banks of memory cells, devices with more than two banks are contemplated.

Figure 1:
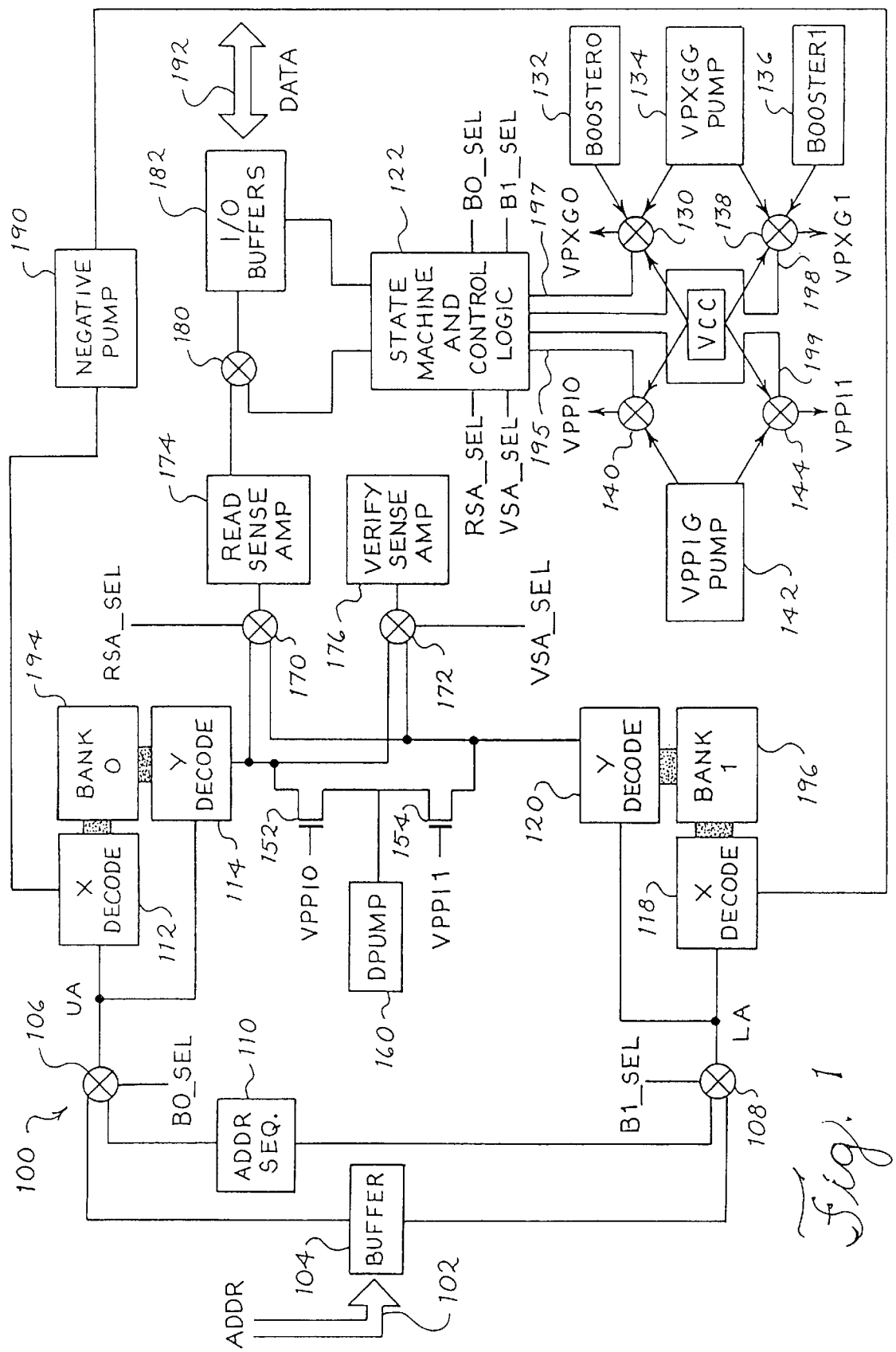
FIG. 1 depicts a block diagram of an exemplary flash memory chip capable of simultaneous reads and writes.

Again referring to FIG. 1, the memory device 100, according to an embodiment of the present invention with a capacity of 32 Mb and operating in word addressable mode, includes a 21 bit address input 102, a 16 bit data input/output ("DATA") 192, power inputs (not shown in FIG. 1) and control inputs (not shown in FIG. 1). It will be appreciated that the memory device 100 with a capacity of 16 Mb only requires 20 address bits and when operating in byte mode, the 32 Mb device 100 requires 22 address bits and the 16 Mb requires 21 address bits. The control inputs include Chip Enable, Output Enable, and Write Enable. The Chip Enable signal activates the chip's control logic and input/output buffers. When Chip Enable is not asserted, the memory device operates in standby mode. Output Enable is used to gate the outputs of the device through I/O buffers during read cycles. Write Enable is used to enable the write functions of the memory device. In one embodiment, all of the components of FIG. 1 are contained on a single integrated circuit chip. Note that address and control inputs for the exemplary flash memory chips are dependent on memory density and interface implementations. It will be appreciated that the disclosed embodiments can work with higher memory densities and alternate interface implementations with their accompanying alternate address and control input configurations.

The memory device 100 further includes address buffer 104, address multiplexers 106 and 108, address sequencer 110, X logical address decoders 112 and 118, Y logical address decoders 114 and 120, memory array Banks 0 and 1 denoted as 194 and 196 respectively, Dpump 160, data multiplexers 170 and 172, read sense amplifiers 174, verify sense amplifiers 176, negative pump 190, output multiplexer 180, state machine and control logic 122, input/output buffers 182, VPPIG Pump 142, booster 0 denoted as 132, VPXGG Pump 134, booster 1 denoted as 136 and power multiplexers 130, 138, 140 and 144. The address input 102 is received by the address buffer 104, which sends the address to the address multiplexer 106 for bank 194 and the address multiplexer 108 for bank 196. The address sequencer 110 is controlled by the state machine and control logic 122. In one embodiment, the address sequencer 110 is part of the state machine and control logic 122. The output of the address sequencer 110 is an address which is sent to both multiplexer 106 and multiplexer 108. The address sequencer 110 is used to generate sequential addresses during an erase sequence. The output of the multiplexer 106, upper address UA, is communicated to the X address decoder 112 and the Y address decoder 114. The output of the multiplexer 108, lower address LA, is sent to the X address decoder 118 and the Y address decoder 120. The multiplexer 106 chooses between the address from the buffer 104 and the address from the address sequencer 110 in response to a control signal B0_SEL. The multiplexer 108 chooses between the address from the address buffer 104 and the address from address sequencer 110 based on a control signal B1_SEL. The selection signals B0_SEL and B1_SEL are generated by the state machine and control logic 122.

Bank 194 and bank 196 are arrays (or sets) of flash memory cells (operation of these individual flash memory cells is discussed in more detail below). The banks 194, 196 are organized by words and then by sectors and can either be byte or word addressable. It will be appreciated by those skilled in the art that other types of non-volatile memory are also within the scope of the present invention. The address decode logic for bank 194 includes the X address decoder 112 and the Y address decoder 114. The X address decoder 112 includes a word line decoder and sector decoder. The word line decoder receives address bits UA[6:14] and the sector decoder receives address bits UA[15:20]. The Y address decoder 114 includes a bit line decoder and Y bit line gating. The bit line decoder receives address bits UA[0:5].

The address decode logic for bank 196 includes the X address decoder 118 and the Y address decoder 120. The X address decoder 118 includes a word line decoder and a sector decoder. The word decoder receives address bits LA[6:14] and the sector decoder receives address bits LA[15:20]. The Y address decoder 120 includes a bit line decoder and Y bit line gating. The bit line decoder receives address bits LA[0:5]. In one embodiment, the address buffer 104 includes a latch to store the address being decoded. In another embodiment, the latch can be part of the decoders 112, 114, 118, 120.

FIG. 1 further shows a multiplexer 130 with three inputs: booster zero 132, VPXGG pump 134 and Vcc. The VPXGG pump 134 is a positive power supply for generating and supplying a regulated positive potential to the control gate of selected flash memory cells via the word lines. Many different voltage pumps known in the art are suitable for use in the present invention. A more detailed explanation of one technology which can be included in VPXGG pump 134 can be found in U.S. Pat. No. 5,291,446, "VPP POWER SUPPLY HAVING A REGULATOR CIRCUIT FOR CONTROLLING A REGULATED POSITIVE POTENTIAL" to Van Buskirk et al, the entire contents of which are incorporated herein by reference. Booster 132 is used to boost the word line during reads. The multiplexer 130 receives a selection signal 197 from state machine and control logic 122 and chooses one of its three inputs to send to the word lines of bank 194 via the X address decoder 112. The output of the multiplexer 130 is labeled as VPXG0. FIG. 1 is drawn to show the three inputs 132, 134 and Vcc connected to a multiplexer in order to simplify the disclosure. A more detailed description of one exemplary implementation can be found in U.S. Pat. No. 5,708,387, "FAST 3-STATE BOOSTER CIRCUIT", to Cleveland et al, the entire contents of which are incorporated herein by reference. Many booster circuits and selection circuits known in the art are suitable for use in the present invention.

FIG. 1 also includes another multiplexer 138 having three inputs: booster one denoted as 136, VPXGG pump 134 and Vcc. Booster 136 is similar to booster 132. The multiplexer 138 operates in a similar fashion to multiplexer 130, and receives its selection signal 198 from the state machine and control logic 122. The output of multiplexer 138 is VPXG1 which is sent to the word lines of bank 196 via the X address decoder 118. The purpose of the multiplexers 130 and 138 is to switch between the three power lines depending on the operation being performed on the particular bank of memory cells.

The VPPIG pump 142 is a high voltage pump used to pass high voltage to the drain of the memory cells. The output of the VPPIG pump 142 is sent to multiplexer 140 and multiplexer 144. Both multiplexers also have Vcc as an input. Multiplexers 140 and 144 switch between inputs based on signals 195 and 199 from the state machine and control logic 122. The output of multiplexer 140 is VPPI0 and the output of multiplexer 144 is VPPI1. During a normal read operation, VPPI1 and VPPI0 are connected to Vcc. VPPI0 is connected to the gate of an N-channel transistor 152. VPPI1 is connected to the gate of an N-channel transistor 154. The source of transistor 152 is connected to Y address decoder 114, multiplexer 170 and multiplexer 172. The drain of transistor 152 is connected to the Dpump 160 and the drain of transistor 154. The Dpump 160 is a drain power supply. Various drain power supplies, known in the art, can be used for the present invention. One exemplary drain pump is disclosed in U.S. Pat. No. 5,263,000, "DRAIN POWER SUPPLY", to Van Buskirk, et al., the entire contents of which are incorporated herein by reference. The source of transistor 154 is connected to multiplexer 170 and multiplexer 172. The source of transistor 154 is also connected to Y address decoder 120 for purposes of accessing the bit lines in bank 196. The connections to multiplexers 170 and 172 provide a path for reading data from bank 194 and bank 196. Multiplexer 170 uses the signal RSA_SEL from the state machine and control logic 122 to selectively choose one of the two input signals to communicate to the read sense amplifiers 174. Multiplexer 172 uses the selection signal VSA_SEL from the state machine and control logic 122 in order to selectively communicate one of its two input signals to the verify sense amplifiers 176. Thus, the two transistors (152 and 154) and the two multiplexers (170 and 172), are used to selectively pass voltages to the drains of selected cells in bank 194 or bank 196 and to selectively read data from either bank 194 or bank 196. For the sake of clarity, the implementation of multiplexers 170 and 172 is illustrative only. Some of the implementation details are not shown in FIG. 1. In the memory device 100, there are actually two sets of sense amplifiers, one set for each bank 194, 196. There are also two sets of verify sense amplifiers. Data from the banks is multiplexed from each bank 194 or 196 to either its read sense amplifier or its verify sense amplifier. When a bank 194 or 196 is using its read sense amplifier, its verify sense amplifier is turned off and vice versa. It will be appreciated that there are many ways to multiplex multiple data sources among multiple destinations.

Data from either bank 194 or bank 196 can be communicated to either the read sense amplifiers 174 or the verify sense amplifiers 176. Both sense amplifiers are in communication with the state machine and control logic 122. While data from bank 194 is communicated to the read sense amplifiers 174, data from bank 196 can be communicated to the verify sense amplifiers 176. While data from bank 194 is communicated to the verify sense amplifiers 176, data from bank 196 can be communicated to the read sense amplifiers 174. The output of the verify sense amplifiers 176 is sent to the state machine and control logic 122, which is used to verify that a particular byte has been programmed or erased. Note that in the memory device 100, the preferred implementation of the read sense amplifiers 174 provides two sets of sense amplifiers, one for each bank 194, 196. Only the sense amplifiers for the bank 194 or 196 undergoing a read operation are active during the read operation. The verify sense amplifiers 176 of the memory device 100 also have two sets of verify amplifiers, one for each bank.

Data from the read sense amplifiers 174 is sent to multiplexer 180. A second input of the multiplexer 180 includes device 100 status information from the state machine and control logic 122 such as whether or not a program or erase is in progress. The selection signal for multiplexer 180 is provided by the state machine and control logic 122.

I/O buffers 182 are used to pass data out and receive data into memory device 100. While a read is being performed on one of the banks, multiplexer 180 will communicate output data from read sense amplifiers 174 to I/O buffers 182. During an erase or program sequence, multiplexer 180 will communicate status information to I/O buffers 182 so that an outside processor can poll the memory device 100 for the status in regard to the erase or program.

The memory device 100 also includes a negative pump 190 that is used to generate a relatively high negative voltage to the control gates of selected memory cells via the word lines of either bank 194 or bank 196, as selected by the state machine and control logic 122. The negative pump 190 is in communication with the X address decoders 112 and 118. One example of a negative pump can be found in U.S. Pat. No. 5,612,921, "LOW SUPPLY VOLTAGE NEGATIVE CHARGE PUMP", to Chang et al, the entire contents of which are incorporated herein by reference.

The state machine and control logic 122 provides the control for read, program and erase operations. Many of the selection lines used to select between bank 194 and bank 196 are controlled by the state machine and control logic 122. Alternatively, the output from the X and Y address decoders 112, 114, 118, 120 can be used to select between banks of memory cells.

The memory device 100 is programmed using an embedded programming sequence and is erased using an embedded erase sequence. The embedded sequences allow a processor to initiate a program or erase sequence and perform other tasks while the program and erase sequences are being carried out. The embedded program and erase sequences are controlled by the state machine and control logic 122, which uses a command register to manage the commencement of either sequence. The erase and programming operations are only accessed via the command register which controls an internal state machine that manages device operations. Commands are written to the command register via the data inputs 192 to the memory device 100.

While one bank is being programmed, the other bank can be accessed for a read operation. For example, during a program of a byte in bank 196, the state machine and control logic 122 would cause multiplexer 108 to select the address from buffer 104 for communication to decoders 118 and 120. Further, the state machine and control logic 122 would store the data byte to be programmed from the I/O buffers 182 for verification when the programming completes. The output of bank 196 would be sent to the verify sense amplifiers 176 via multiplexer 172 for comparison with the stored input data. During a simultaneously initiated read operation to bank 194, the state machine and control logic 122, after storing away the data to be programmed, instructs multiplexer 106 to select the address from the buffer 104 for communication to the X and Y address decoders 112 and 114. The output of bank 194 would be sent to the read sense amplifiers 174 via multiplexer 170. The output of the read sense amplifiers 174 would be sent, via multiplexer 180, to the I/O buffers 182 and then to the data bus 192.

Similarly, during an erase of a sector in bank 194, the state machine and control logic 122 would cause multiplexer 106 to select the addresses from the address sequencer 110. The address sequencer 110 would be used to cycle through all the bytes in a particular sector to make sure that each byte is preprogrammed. The sector is subsequently bulk erased. After erasure, the address sequencer 110 would be used to generate addresses to verify each byte of this erased sector. While bank 194 is being erased and multiplexer 106 is selecting an address from the address sequencer 110, a read operation can be carried out in bank 196 by using multiplexer 108 to select the address from the buffer 104 rather than an address from address sequencer 110. During the verify operation of the erase method for bank 194, the state machine and control logic 122 would be verifying the data using the verify sense amplifiers 176, while read data from bank 196 would be communicated to the read sense amplifiers 174. Thus, each bank has two input address paths and two output data paths that can be multiplexed so that either bank can be read from while the other bank is simultaneously being written to.

In the memory device 100, each memory cell, within the banks 194 or 196, includes a nor-type floating gate transistor. It will be appreciated by those skilled in the art, however, that there are many ways to implement a flash memory cell and that the configurations and operating characteristics may vary. It will further be appreciated that the embodiments disclosed herein are generally applicable and not limited to one particular implementation of a flash memory cell. The exemplary transistor has three connections called the source, drain and control gate. In a typical flash memory array, the control gates of the memory cells are connected to the word lines of the array which are used to address the data stored in the array. The sources are selectively connected to ground (for a read operation) depending on which bits are to be read. The drains are connected to the bit lines which are used to sense/read the stored data out of the array.

During an erase operation, the source input of the memory cell transistor is connected to a high positive voltage, the drain/bit line is left to float and the control gate/word line is connected to a relatively high negative voltage supplied by the negative pump 190. An exemplary high positive voltage applied to the source during an erase is approximately 5 volts and an exemplary high negative voltage applied to the control gate/word line by the negative pump 190 is approximately minus 9 volts although other voltages and input combinations can be used. Based on this input configuration, any charge stored on the floating gate of the memory cell transistor will discharge by flowing out to the source due to Fowler-Nordheim Tunneling.

During a program operation, the source input of the memory cell transistor is connected to ground, the drain/bit line is connected to a high positive voltage provided by the VPPIG Dpump drain power supply 142 and the control gate/word line is connected to a high voltage provided by the VPXGG pump positive power supply 134. An exemplary high voltage applied to the drain by the VPPIG 142 is approximately 5 Volts while an exemplary high voltage applied to the control gate by the VPXGG 134 pump is approximately 9 Volts. It will be appreciated by those skilled in the art that other voltage and input combinations can also be used. Based on this input configuration, charge will flow by hot electron transfer to the floating gate of the memory cell transistor and accumulate there.

While programming and erasing the memory cell require higher than normal voltages, reading from the cell only requires the availability of the normal supply voltage. To read from the memory cell, the source is connected to ground (also referred to as Vss) and the control gate/word line are connected to the booster power supplies 132, 136. Prior to selecting the transistors for a read, the bit lines are charged up via the Dpump 160. When the cells turn on (if erased), they will connect their respective bit line to ground, grounding out the bit line. The current value of the memory cell is then sensed from the drain/bit line connection. There is a booster power supply 132 for bank 194 and a booster power supply 136 for bank 196. The booster power supplies 132, 136 are used to boost the word lines of bank 194 or bank 196 during a read operation. An exemplary Vcc supply voltage is 3.0 Volts although other supply voltages are known in the art. An exemplary booster voltage is 5.0 Volts, although the use of the other voltages on the control gate for read operations is possible. If there is charge stored on the floating gate, i.e. the memory cell has been programmed, the flow of current from the drain to the source (ground) will be inhibited and the memory cell will read as a logical "0". If the memory cell has been erased, there will be no charge stored on the floating gate and with a voltage applied to the control gate greater than the threshold voltage of the transistor, current will flow from the drain to the source and the memory cell will read as a logical "1". Note that a transistor that is on, grounds its respective bit line. Data read out of the array is considered in its complimentary form, therefore the grounded bit lines are interpreted as logical 1's and the non-grounded bit lines are considered logical 0's.

Application of the particular voltages necessary for each operation is handled by the state machine and control logic 122. This logic 122 controls the multiplexers 130, 138, 140, 144 that place the proper voltages from the various power supplies 132, 134, 136, 142 and Vcc on the memory cell inputs depending on the desired function.

While the total capacity of the simultaneous read and write capable flash memory device 100 is 16 or 32 MB or higher, how that capacity is distributed among the available banks is variable. Users of simultaneous read and write capable flash memory may need different bank partition sizes depending on their applications. To meet the varying needs of users, the flash memory device 100 preferably implements a sliding bank architecture. This architecture allows the simplified design and manufacture of simultaneous flash memory devices with varied bank partition sizes. To alter the bank sizes, only a single metal layer of the chip needs to be altered. For a more detailed discussion of the sliding bank architecture, refer to co-pending and commonly assigned U.S. patent application Ser. No. 09/159,142, "SIMULTANEOUS OPERATION FLASH MEMORY DEVICE WITH A FLEXIBLE BANK PARTITION ARCHITECTURE", filed Sep. 23, 1998, U.S. patent application Ser. No. 09/159,029, "METHOD OF MAKING FLEXIBLY PARTITIONED METAL LINE SEGMENTS FOR A SIMULTANEOUS OPERATION FLASH MEMORY WITH A FLEXIBLE BANK PARTITION ARCHITECTURE", filed Sep. 23, 1998 and U.S. patent application Ser. No. 09/159,489, "BANK SELECTOR CIRCUIT FOR A SIMULTANEOUS OPERATION FLASH MEMORY DEVICE WITH A FLEXIBLE BANK PARTITION ARCHITECTURE", filed Sep. 23, 1998, the entire contents of each of which are incorporated herein by reference. The sliding bank architecture enables the memory device 100 to be produced in many different configurations with only a single mask change in one of the final steps of production. In the case where the flash memory device 100 has a capacity of 32 megabits (Mb), partitions where bank 194 has a capacity 4 or 8 Mb and bank 196 has a capacity of 28 or 24 Mb respectively, can be used. In the case where the flash memory device 100 has a capacity of 16 Mb, partitions where bank 194 has a capacity of 2 or 4 Mb and bank 196 has a capacity of 14 or 12 Mb respectively, can be used. This has the advantages that many different configurations of the flash memory device 100 can share much of the same basic design, process and manufacturing expense.

Turning to the present invention and FIG. 1, the flash memory device 100 includes an array of memory cells or banks 194, 196 for storing bits of data. A read sense amplifier 174 reads the contents of these memory cells 194, 196. The memory device 100 employs a multitude of sense amplifiers 174, so that for each of the banks 194, 196 one read sense amplifier 174 is provided for each of the memory device's data input/output pins 192. Thus, where the present flash memory device 100 includes two banks 194, 196 and sixteen data input/output pins 192, a total of thirty-two read sense amplifiers 174 are provided. Vendors of semiconductor products are continuously pressured to develop new products that are faster than older generations in order to satisfy market demand. The present invention satisfies this need by allowing the read time of the flash memory device 100 to be optimized for individual memory devices 100.

Figure 2:
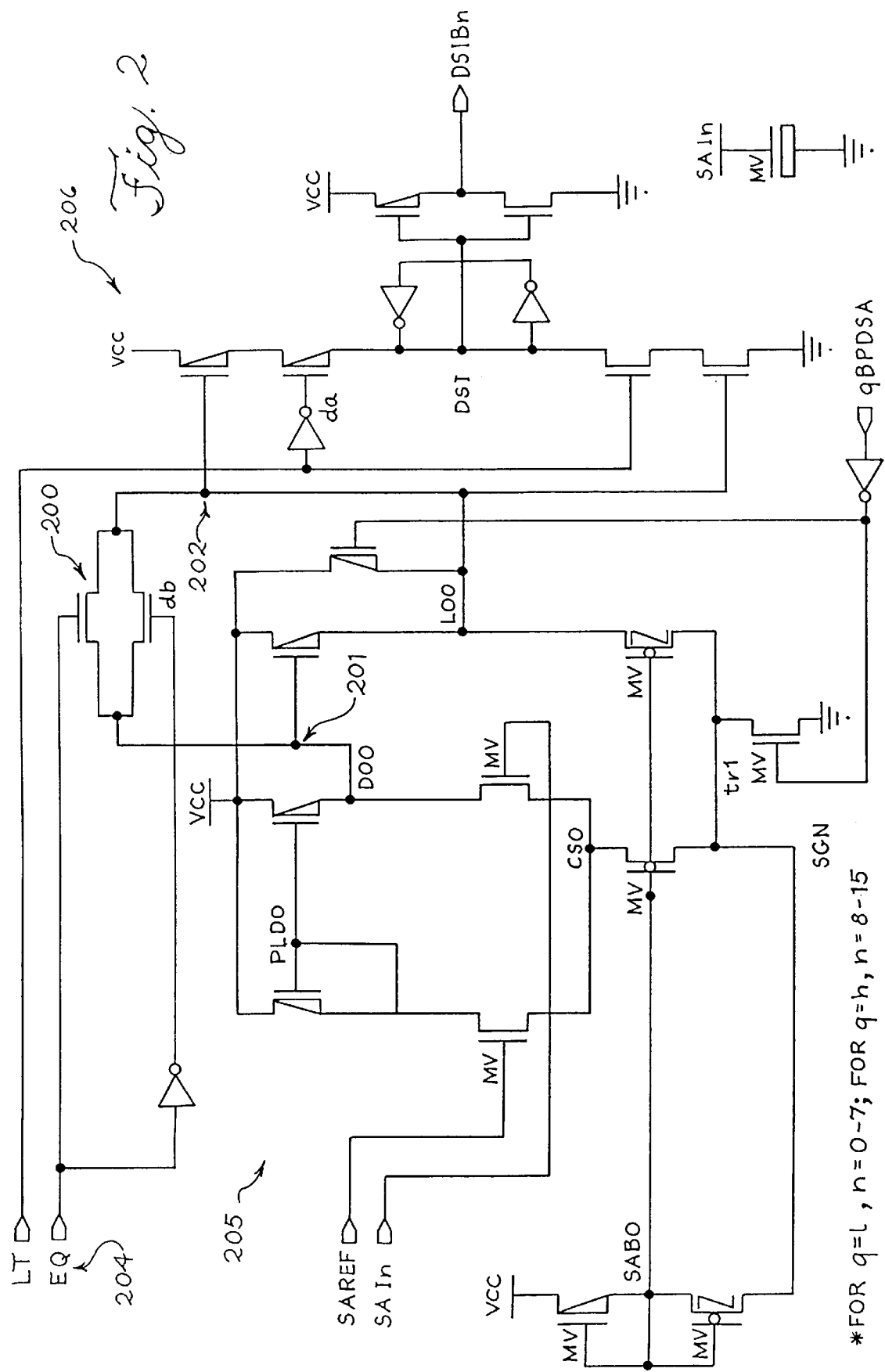
FIG. 2 depicts a schematic diagram of a read sense amplifier.

As shown in FIG. 2, each of the read sense amplifiers 174 include an equalization circuit 200 to increase the operating speed of the sense amplifier 174. As will be readily appreciated by one skilled in the art, the equalization pulse 204 equalizes the first stage 205 and the second stage 206 of the read sense amplifier 174 by equalizing the first stage node 201 and the second stage node 202. The equalization circuit 200 is well-known in the art, therefore the principle of operation need not be explained. The equalization circuit 200 is controlled by the equalization pulse 204, which is a signal that is asserted for a pulse length of about 16 ns to 54 ns during each read cycle. The durational length of the equalization pulse 204, however, limits the speed at which the read sense amplifier 174 can operate. Therefore, an equalization pulse 204 which is short in duration allows the read sense amplifier 174 to operate at a faster speed. On the other hand, if the equalization pulse 204 is shorter than the minimum time required to allow the equalization circuit 200 to equalize the first stage node 201 and the second stage node 202, the sense amplifier 174 will fail to operate correctly and will produce incorrect data that does not match the actual contents of the memory array 194, 196.

The optimal durational length of the equalization pulse 204, at which the read sense amplifier 174 operates correctly and yet as fast as possible, depends on the manufacturing process variations of the memory device 100. Accordingly, the present invention involves adjusting the durational length of the equalization pulse 204 in the memory device 100 to achieve optimal read access times. The present invention satisfies this desire by providing a system by which the read sense amplifier 174 can be tested with eight different equalization pulse 204 settings of varying durational lengths. The optimal durational length of the equalization pulse 204 can then be determined and permanently programmed into the memory device 100 to ensure optimal read access times for the end user.

Turning then to FIG. 3, the testing mode of the memory device 100 includes a number of individual test functions with corresponding test circuits. An equalization test mode signal 302 is provided which is asserted when the user enters the equalization pulse test mode. The memory device 100 includes a number of user functions which can be accessed by asserting various signal combinations on the input pins 192 of the memory device 100. Because the methods of designing user functions and manner of using these functions are well-known to those skilled in the art, further explanation of this aspect is unnecessary. As will be appreciated from the equalization pulse test mode circuit 300 in the drawing, the test mode signal 302 becomes asserted when the three signals SECUH 305, WEH 306, and CEHB 307 are asserted. These three signals 305, 306, 307 are asserted when the user enters the test mode, and therefore the equalization test mode signal 302 is asserted while the test mode is in operation. When the test mode is exited by the user, the equalization pulse test mode signal 302 becomes deasserted.

Turning to FIG. 4, once the test mode is entered by the user, a number of inputs 410, 411, 412 are routed through corresponding switching circuits 402, 404, 406 to the switching circuit outputs 418, 419, 420. In the preferred embodiment, a portion of the address inputs 102 are used as the inputs 410, 411, 412. The switching circuits 402, 404, 406 are used to route either the inputs 410, 411, 412 or the attribute memory cells 802 to the switching circuit outputs 418, 419, 420. When the equalization pulse test mode is operating, the switching circuit 402, 404, 406 routes the inputs 410, 411, 412 to the switching circuit outputs 418, 419, 420; whereas when the test mode is not operating, the attribute memory cells 802 are routed to the switching circuit outputs 418, 419, 420.

To accomplish the above described switching result with the switching circuits 402, 404, 406, a number of switching control signals 302, 407, 408, 409 and a number of pass gates 422, 423, 424, 425, 426, 427 are provided. The equalization pulse test mode signal 302 passes through a control circuit 400 in order to create an inverse signal 407 of the test mode signal 302, a test mode pulse 408, and an inverse signal 409 of the test mode pulse 408. As is generally well-known in the art, a pass gate requires a control signal, which is coupled to an n-channel transistor, and an inverse signal of the control signal, which is coupled to a p-channel transistor. Thus, when the control signal for a pass gate is asserted, the input to the pass gate passes through the pass gate, but when the control signal is deasserted, the input is blocked from passing through the pass gate.

The test mode pulse 408 is a short pulse signal which is asserted at the moment that the test mode signal 302 becomes asserted. However, the test mode pulse 408 only remains asserted for about 5 to 10 ns. Therefore, the asserted or deasserted condition of the inputs 410, 411, 412 is passed through the input pass gates 423, 425, 427 of the switching circuits 402, 404, 406, respectively, when the equalization pulse test mode is entered and during the short duration of the test mode pulse 408. Thus, the inputs 410, 411, 412 must be set at their desired condition before the test mode is entered. Shortly after the test mode is entered and after the test mode pulse 408 becomes deasserted again, the input pass gates 423, 425, 427 close and the inputs 410, 411, 412 are blocked. The inputs 410, 411, 412 then pass to latch circuits 428, 429, 430, which are well-known to those skilled in the art, in order to sustain the level of the signals. In order to block the outputs 414, 415, 416 of the attribute memory circuits 800, the inverse of the test mode signal 407 is coupled to the n-channel of the attribute memory cell pass gates 422, 424, 426 shown in FIG. 4.

Figure 5:
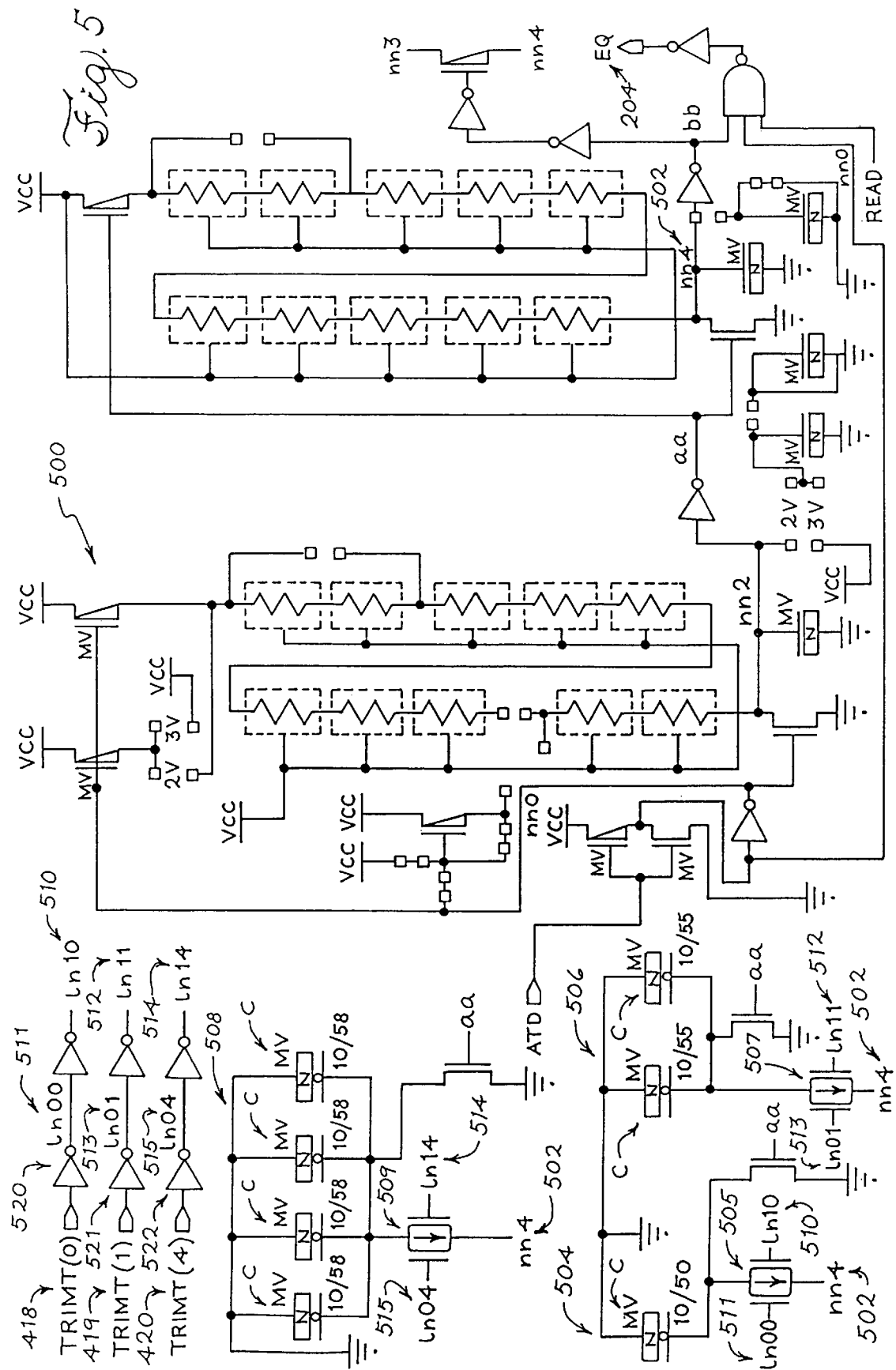
FIG. 5 depicts a schematic diagram of a timing circuits that creates the equalization pulse; three capacitor circuits that can be coupled to the timing circuit, and three sets of inverters that create control signals for the capacitor circuits.

Turning next to FIG. 5, a timing circuit 500 creates the equalization pulse 204. The durational time of the equalization pulse 204 is lengthened by adding capacitors C to the timing circuit 500 in order to introduce a delay in the circuit 500. The present invention, therefore, allows the number of capacitors C that are added to the timing circuit 500 via capacitor circuits to be variable so that more or less capacitors C can be added in order to shorten or lengthen the equalization pulse 204 to achieve the optimal durational length. Thus, a timing circuit node 502 is provided where varying numbers of capacitors C can be coupled to or decoupled from the timing circuit 500.

To create the necessary control signals 510, 511, 512, 513, 514, 515 which determine the number of capacitors C to be coupled to the timing circuit 500, the switching circuit outputs 418, 419, 420 pass through a set of inverters 520, 521, 522. The inverters 520, 521, 522 boost any signal degradation that occurs in the switching circuit outputs 418, 419, 420. The inverters 520, 521, 522 also create inverse signals 511, 513, 515 and equivalent signals 510, 512, 514 of the switching circuit outputs 418, 419, 420. Capacitor circuit pass gates 505, 507, 509, which operate like those previously discussed, are coupled to a number of corresponding capacitor circuits 504, 506, 508 and the timing circuit node 502. The inverse signal 511, 513, 515 corresponding to each of the switching circuit outputs 418, 419, 420 is coupled to the n-channel transistor, while the equivalent signal 510, 512, 514 is coupled to the p-channel transistor. Therefore, when the switching circuit output 418, 419, 420 is asserted, the corresponding capacitor circuit pass gate 505, 507, 509 opens and the capacitor circuit 504, 506, 508 becomes coupled to the timing circuit node 502. Likewise, when the switching circuit output 418, 419, 420 is deasserted, the capacitor circuit pass gate 505, 507, 509 closes, and the capacitor circuit 504, 506, 508 becomes decoupled from the timing circuit node 502.

Thus, by applying various combinations of asserted and deasserted conditions to each of the switching circuit outputs 418, 419, 420, varying numbers of capacitors C can be coupled to the timing circuit 500. Although variations on the embodiment described are contemplated to be within the scope of the present invention, the preferred embodiment provides three different capacitor circuits 504, 506, 508. As is readily apparent from the drawing, the first capacitor circuit 504 includes one capacitor C, the second capacitor circuit 506 includes two capacitors C, and the third capacitor circuit 508 includes four capacitors C. Each of the capacitors C in the capacitor circuits 504, 506, 508 have similar capacitance values to each other. Where the capacitance is measured in the width to length ratio of the capacitor C, the one capacitor C in the first capacitor circuit 504 has a width to length ratio of 10/50, the two capacitors C in the second capacitor circuit 506 each have a width to length ratio of 10/55, and the four capacitors C in the third capacitor circuit 508 each have a width to length ratio of 10/58. Turning to FIG. 6, eight variations on the number of capacitors C coupled to the timing circuit are possible. For example, when each of the switching circuit outputs 418, 419, 420 is asserted, zero capacitors C are coupled to the timing circuit 500. This combination results in the shortest equalization pulse 204 length, which is about 16.2 ns. At the other end of the spectrum, when each of the switching circuit outputs 418, 419, 420 is deasserted, all seven of the capacitors C in the capacitor circuits 504, 506, 508 are coupled to the timing circuit 500. This combination results in the longest equalization pulse 204 length, which is about 45 ns. As is readily apparent from FIG. 6, each of the combinations between these two examples provides equal incremental changes to the durational length of the equalization pulse 204.

Figure 7:
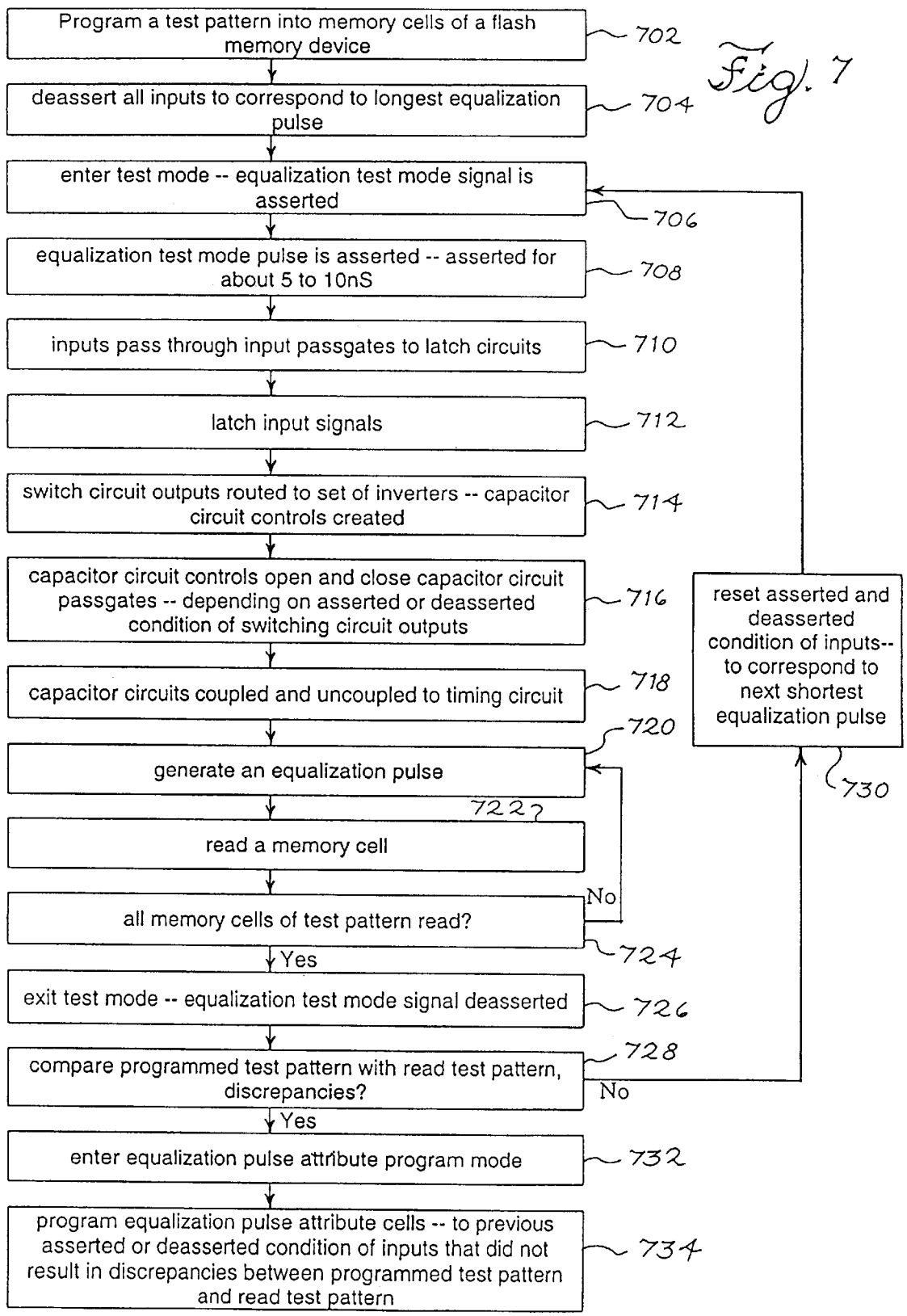
FIG. 7 shows a flow chart for a testing sequence to determine the optimal combination of capacitors to be coupled to the timing circuit.

Turning to FIG. 7, in order to determine the optimal number of capacitors C to couple to the timing circuit 500, a repetitive testing sequence is provided. The memory cells 194, 196 of the memory device 100 are initially programmed with a test pattern per step 702. The inputs 410, 411, 412 are then all deasserted to correspond to a condition in which all of the capacitors C will be coupled to the timing circuit 500 per step 704. This combination of inputs 410, 411, 412 will result in the longest equalization pulse available. As previously discussed and explained, the test mode is entered during step 706, the inputs 410, 411, 412 are routed through the switching circuits per steps 708, 710, 712, and the switching circuit outputs 418, 419, 420 control which capacitor circuits 504, 506, 508 are coupled and decoupled from the timing circuit 500 during steps 714, 716, 718. Each of the memory cells 194, 196 in the memory device 100 are then read using the equalization pulse 204 that results from the selected combination of coupled and uncoupled capacitors C (see steps 720, 722, 724). Once all the memory cells 194, 196 are read, the test mode is exited during step 726 and the originally programmed test pattern is compared with the test pattern that was read during step 728. If the programmed test pattern and the read test pattern are equal to each other and no discrepancies exist between the two patterns, the equalization pulse 204 might be longer than necessary. Therefore the preceding procedures of steps 706, 708, 710, 712, 714, 716, 718, 720, 722, 724, 726, 728 are repeated with the asserted and deasserted condition of the inputs 410, 411, 412 set to a combination that will provide the next shortest equalization pulse available during step 730. This repeating sequence is continued until the programmed test pattern and the read test pattern differ from each other and discrepancies exist between the two patterns. These discrepancies will occur when the equalization pulse 204 is shorter than the structure of the memory device 100 can accept for proper functioning of the read sense amplifier 174. Thus, once a repetition produces discrepancies, it can be readily determined that the equalization pulse 204 of the immediately prior repetition is the optimal durational length. The optimal equalization pulse 204, therefore, has the shortest durational length which does not create any discrepancies between the programmed test pattern and the read test pattern. Finally, once the optimal combination of coupled and uncoupled capacitor circuits 504, 506, 508 is determined, the corresponding asserted and deasserted condition of the inputs 410, 411, 412 is programmed into equalization pulse attribute cells 802.

Figure 8:
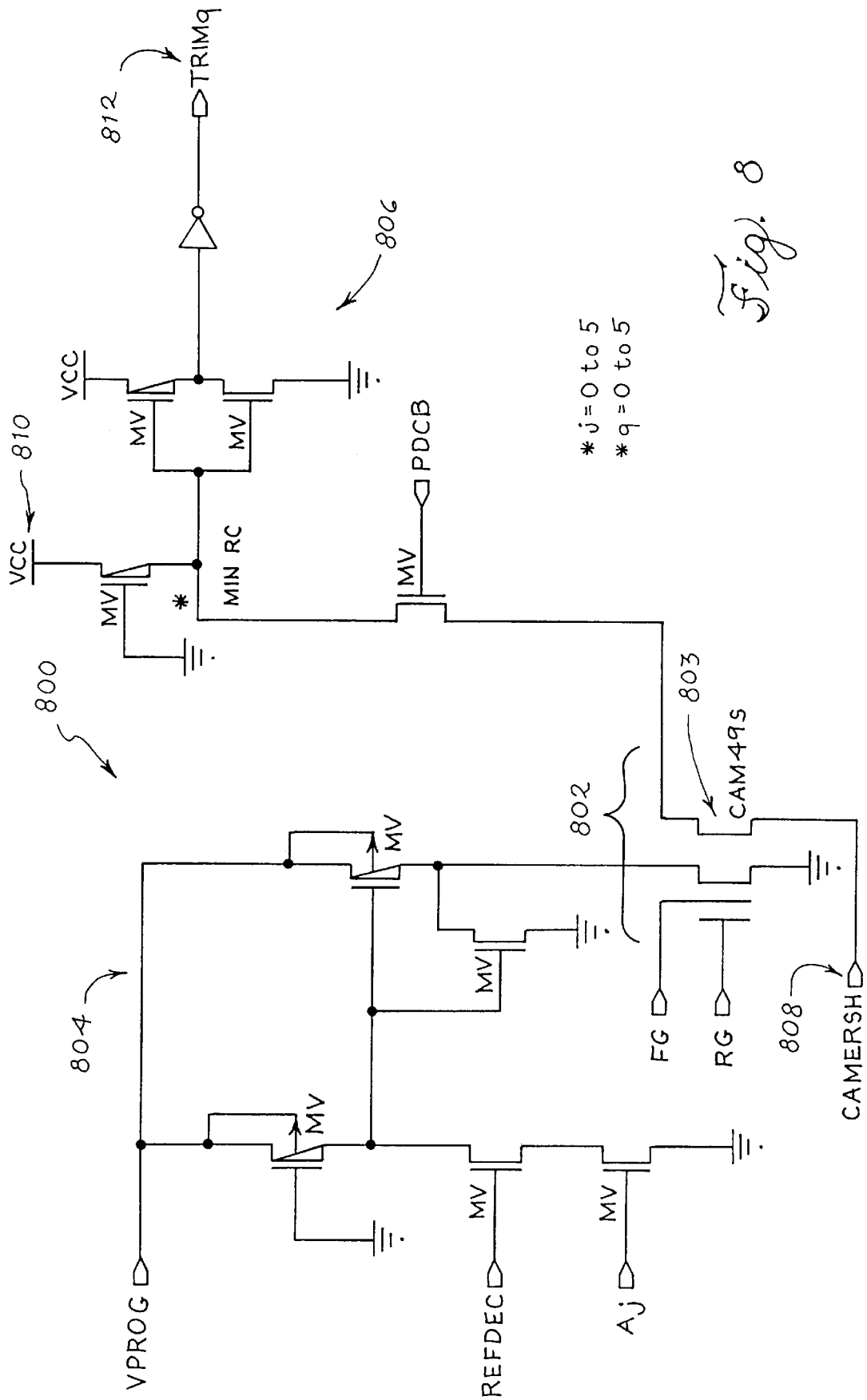
FIG. 8 shows a single representative equalization pulse attribute memory circuit for permanently storing the optimal combination of capacitors to be coupled to the timing circuit.

Turning to FIG. 8, equalization pulse attribute memory circuits 800 permanently store the asserted and deasserted condition of the inputs 410, 411, 412 that resulted in the optimal combination of coupled and uncoupled capacitors C during the testing sequence. The drawing shows a single attribute memory circuit 800; however an equal number of attribute memory circuits 800 are provided to correspond to the number of inputs 410, 411, 412, so that the attribute memory circuit output 812 represents a number of individual attribute memory circuit outputs 414, 415, 416. Each attribute memory circuit 800 includes an equalization pulse attribute memory cell 802, which is a dual flash memory cell with two transistors that are coupled together. Additionally, a programming circuit 804 and a read circuit 806 is provided. The programming circuit 804 programs or erases the attribute memory cell 802 with the desired contents in a manner well-known to one skilled in the art. In normal operation the erase signal 808 is coupled to a ground. Therefore, when the attribute memory cell 802 is erased, the read transistor 803 will be opened and the voltage supply 810 to the read circuit 806 will be grounded out, thus causing the attribute memory circuit output 812 to be deasserted. Likewise, when the attribute memory cell 802 is programmed, the read transistor 803 will be closed and the voltage supply 810 will not be grounded out, thus causing the attribute memory circuit output 812 to be asserted.

Turning next back to FIG. 4, during normal operation of the memory device 100, the permanently stored contents of the equalization pulse attribute memory cells 802 determine which capacitor circuits 504, 506, 508 are coupled to the timing circuit 500 and which capacitor circuits 504, 506, 508 are decoupled. Therefore, the outputs 414, 415, 416 of the attribute memory circuits 800 are routed to the corresponding switching circuits 402, 404, 406. Within each switching circuit 402, 404, 406, the inverse signal 407 of the test mode signal 302 is coupled to the n-channel transistor of the attribute memory cell pass gate 422, 424, 426, and the test mode signal 302 is coupled to the p-channel transistor. Thus, when the test mode is not in operation, the attribute memory cell pass gates 422, 424, 426 open and pass the outputs 414, 415, 416 of the attribute memory circuits 800 to the corresponding latch circuits 428, 429, 430. Because the test mode is not in operation during normal operation of the memory device 100, the input pass gates 423, 425, 427 remain closed and block the inputs 410, 411, 412. The outputs 414, 415, 416 of the switching circuits 800 then control the coupling and decoupling of the capacitor circuits 504, 506, 508 to the timing circuit 500 as previously described. Therefore, the optimal number of capacitors C, that was determined during the testing sequence, is coupled to the timing circuit 500 during normal operation of the memory device 100.

It is to be noted that suitable transistor sizes specifying channel width to length ratios (measured in micrometers or microns) for the transistors which make up the depicted circuits have been omitted from the figures. It will be appreciated that suitable ratios may be chosen depending on the design requirements and the capabilities and limitations of the particular integrated circuit fabrication process used for implementation of the circuit as well as the performance requirements of the specific embodiment.

It is therefore intended that the foregoing detailed description be regarded as illustrative rather than limiting, and that it be understood that it is the following claims, including all equivalents, that are intended to define the spirit and scope of this invention.

We claim:

1. An electrical circuit for optimizing an equalization pulse of a read sense amplifier in a memory chip comprising:
   (a) a memory chip
   (b) one or more capacitor circuits;
   (c) one or more capacitor circuit controls corresponding to each of said one or more capacitor circuits;
   (d) at least one input corresponding to each of said one or more capacitor circuits;
   (e) at least one attribute cell corresponding to each of said one or more capacitor circuits;
   (f) a switching device for alternately coupling each of said inputs and each of said attribute cells to said corresponding controls; and
   (g) an equalization pulse circuit, wherein
      (i) each of said one or more capacitor circuits are coupled to said equalization pulse circuit when said corresponding capacitor circuit control is asserted, and
      (ii) each of said one or more capacitor circuits are decoupled from said equalization pulse circuit when said capacitor circuit control is deasserted.

2. The electrical circuit according to claim 1, wherein said memory chip is a flash memory chip.

3. The electrical circuit according to claim 1, wherein said one or more capacitor circuits includes at least three circuits.

4. The electrical circuit according to claim 3, wherein
   (g) said one or more capacitor circuits, comprises
      (i) a first capacitor circuit comprising four capacitors,
      (ii) a second capacitor circuit comprising two capacitors, and
      (iii) a third capacitor circuit comprising one capacitors
   (h) the capacitance of each of said capacitors in said first capacitor circuit, said second capacitor circuit, and said third capacitor circuit is about the same.

5. The electrical circuit according to claim 1, further comprising:
   (g) a test mode signal that is asserted when said memory chip is in a test mode and is deasserted when the memory chip is not in the test mode;
   (h) a test mode pulse signal wherein a single pulse is asserted when said test mode signal is asserted; and
   (i) said switching device having one or more corresponding switching circuits, wherein each switching circuit comprises
      (i) a latch circuit that is coupled to said corresponding capacitor control,
      (ii) an input gate that passes said corresponding input to the latch circuit when said test mode pulse signal is asserted, and
      (iii) an attribute cell gate that passes the contents of said corresponding attribute cell to the latch circuit when said test mode signal is deasserted.

6. The electrical circuit according to claim 5, wherein said one or more capacitor circuits includes at least three circuits.

7. The electrical circuit according to claim 6, wherein
   (a) said one or more capacitor circuits includes a number of capacitors with similar capacitance values, wherein
      (i) a first capacitor circuit has four of the capacitors,
      (ii) a second capacitor circuit has two of the capacitors, and
      (iii) a third capacitor circuit has one of the capacitors.

8. The electrical circuit according to claim 7, wherein said memory chip is a flash memory chip.

9. A method for determining an optimal width of an equalization pulse in a read sense amplifier of a memory chip, comprising:
   (a) programming a memory array of a memory chip with a test pattern of data;
   (b) determining one or more capacitor circuits to be coupled to an equalization pulse circuit that generates an equalization pulse;
   (c) coupling said one or more capacitor circuits to said equalization pulse circuit;
   (d) reading said programmed test pattern of said memory array;
   (e) comparing said read test pattern with said programmed test pattern and determining discrepancies; and
   (f) determining an optimal width of said equalization pulse wherein said discrepancies are minimized.

10. The method according to claim 9, wherein said memory chip is a flash memory chip.

11. The method according to claim 9, wherein said one or more capacitor circuits comprises three circuits each having different capacitance values.

12. The method according to claim 9, further comprising:
 (g) setting a series of input signals to a combination of asserted and deasserted signals, wherein
  (i) the number of the input signals equals the number of said capacitor circuits,
  (ii) each of the input signals corresponds to one of said one or more capacitor circuits, and
  (iii) each of said one or more capacitor circuits is coupled to said equalization circuit when said corresponding input signal is asserted and is decoupled when said corresponding input signal is deasserted; and
 (h) changing the combinations of said series of input signals in order to determine an optimal combination of said capacitor circuits to couple to said equalization pulse circuit, wherein
  (i) the optimal combination of the capacitor circuits produces no discrepancies between said read test pattern and said programmed test pattern, and
  (ii) the optimal combination of the capacitor circuits allows said read sense amplifier to read said memory array faster than other combinations of capacitor circuits that do not produce said discrepancies.

13. The method according to claim 12, further comprising:
 (i) entering a test mode;
 (j) passing said series of input signals to a series of latches when said test mode is entered;
 (k) blocking a series of attribute signals from a series of attribute memory cells during the duration of said test mode; and
 (l) exiting said test mode.

14. A method for using an optimal width of an equalization pulse in a read sense amplifier of a memory chip, comprising:
 (a) passing a series of attribute signals to an equalization pulse circuit, wherein
  (i) the series of attribute signals corresponds to the contents of a series of attribute memory cells, and
  (ii) the combination of the series of attribute signals represents said optimal width of said equalization pulse; and
 (b) coupling a combination of a series of capacitor circuits to said equalization pulse circuit, wherein
  (i) the number of the capacitor circuits equals the number of said attribute signals,
  (ii) each of the capacitor circuits corresponds to one of said attribute signals, and
  (iii) each of the capacitor circuits is coupled to said equalization circuit when said corresponding attribute signal is asserted and is decoupled when said corresponding attribute signal is deasserted.

15. The method according to claim 14, wherein said memory chip is a flash memory chip.

16. The method according to claim 14, wherein said series of capacitor circuits comprises three circuits each having different capacitance values.

17. The method according to claim 14, further comprising:
 (c) blocking a series of input signals from said equalization pulse circuit.

* * * * *